(12) United States Patent
Lee et al.

(10) Patent No.: US 11,837,306 B2
(45) Date of Patent: Dec. 5, 2023

(54) STORAGE SUBSYSTEM READ VOLTAGE DETERMINATION SYSTEM

(71) Applicant: Dell Products L.P., Round Rock, TX (US)

(72) Inventors: Frederick K. H. Lee, Mountain View, CA (US); Robert Proulx, Holden, MA (US); Jie Wu, San Jose, CA (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/727,716

(22) Filed: Apr. 23, 2022

(65) Prior Publication Data

US 2023/0343408 A1  Oct. 26, 2023

(51) Int. Cl.
*G11C 29/42* (2006.01)
*H03M 13/01* (2006.01)
*G11C 29/12* (2006.01)
*G11C 29/46* (2006.01)

(52) U.S. Cl.
CPC ........ *G11C 29/42* (2013.01); *G11C 29/12005* (2013.01); *G11C 29/46* (2013.01); *H03M 13/015* (2013.01)

(58) Field of Classification Search
CPC ... G11C 29/42; G11C 29/12005; G11C 29/46; H03M 13/015
USPC ......................................................... 714/758
See application file for complete search history.

(56) References Cited

U.S. PATENT DOCUMENTS

| 11,488,684 | B1* | 11/2022 | Sharon | G11C 29/021 |
| 2015/0178153 | A1* | 6/2015 | Kim | G06F 11/1048 |
| | | | | 714/764 |
| 2018/0046373 | A1* | 2/2018 | Xiong | G06F 3/0679 |
| 2023/0035983 | A1* | 2/2023 | Wang | G11C 16/102 |
| 2023/0036490 | A1* | 2/2023 | Wang | G11C 16/10 |
| 2023/0072467 | A1* | 3/2023 | Thiers | G11C 29/028 |
| 2023/0101414 | A1* | 3/2023 | Hassner | G11C 29/4401 |
| | | | | 714/764 |

* cited by examiner

*Primary Examiner* — James C Kerveros
(74) *Attorney, Agent, or Firm* — Joseph Mencher

(57) ABSTRACT

A storage subsystem read voltage determination system coupled to a first storage subsystem may read data from the first storage subsystem at a plurality of different read voltage sets and, for each of the plurality of read voltage sets, generate a respective bit error probability distribution of a number of bit errors per codeword provided by the data read from the first storage subsystem. The storage subsystem read voltage provisioning system also generates an error correction capability graph associated with error correction code used by the first storage subsystem and, based on the bit error probability distributions and the error correction capability graph, generates a respective average codeword error rate for each of the plurality of read voltage sets. The storage subsystem read voltage provisioning system then identifies a first read voltage set for which a minimum average codeword error rate was determined.

20 Claims, 11 Drawing Sheets

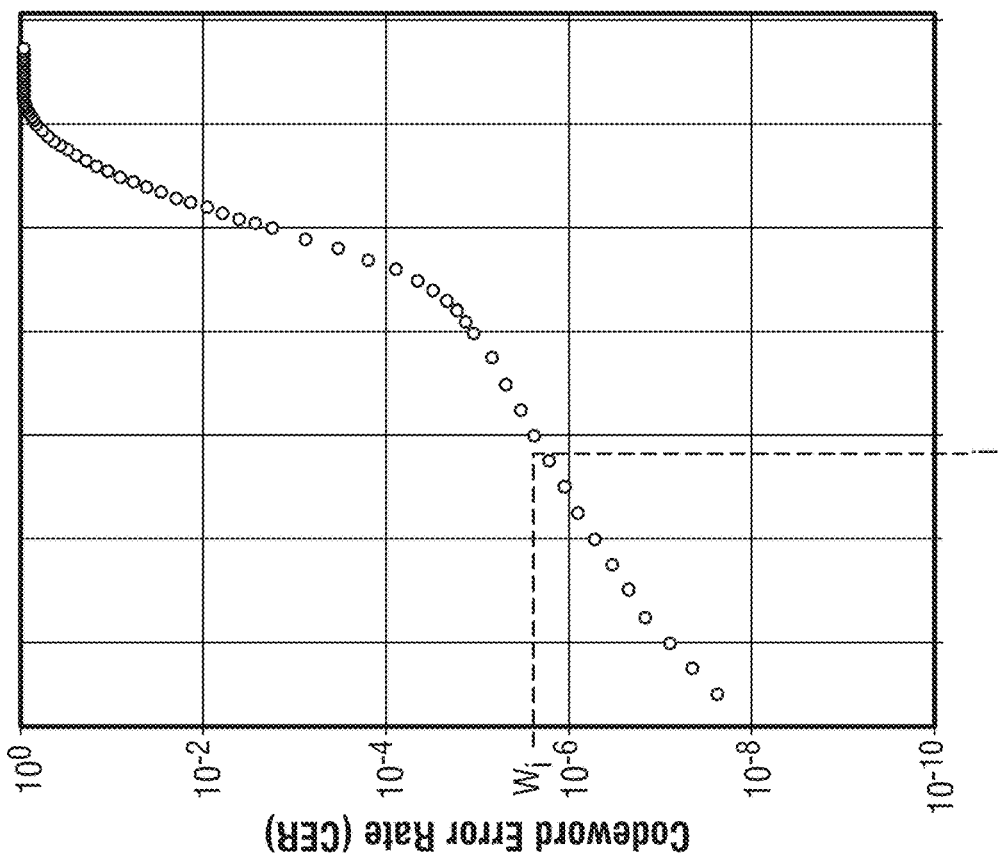
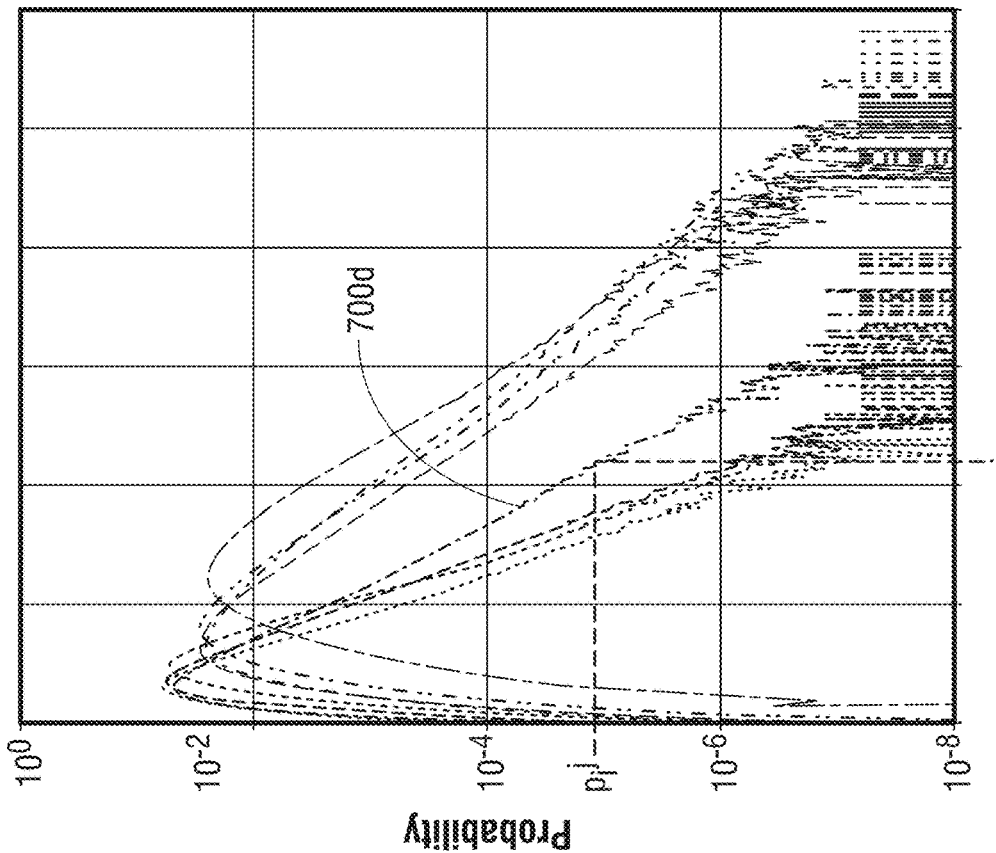
FIG. 10

STORAGE SUBSYSTEM READ VOLTAGE DETERMINATION SYSTEM

BACKGROUND

The present disclosure relates generally to information handling systems, and more particularly to determining read voltages for storage subsystems used in information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, desktop computing devices, laptop/notebook computing devices, tablet computing devices, mobile phones, and/or other computing devices known in the art, include storage systems for storing data. Such storage systems may be provided by Solid State Drive (SSD) storage devices that may include, for example, NAND storage subsystems which provide for the storage of the data discussed above. As will be appreciated by one of skill in the art in possession of the present disclosure, NAND storage subsystem include NAND cells that store the data discussed above, and "read voltages" may be determined for those NAND cells in an attempt to minimize the number of errors that occur when data is read from the NAND cells. However, the conventional determination of read voltages for NAND cells can raise some issues.

For example, conventional NAND storage subsystem read voltage determination systems operate to determine read voltages for NAND cells by selecting read voltages that minimize the average number of bit errors per codeword stored by the NAND cells. While such conventional NAND storage subsystem read voltage determinations may be sufficient for some NAND storage systems such as those that use particular types of Error Correction Code (ECC) (e.g., Bose, Chaudhuri, and Hocquenghem (BCH) ECC), the inventors of the present disclosure have discovered that read voltage determinations for NAND storage systems that use other types of ECC (e.g., Low-Density Parity Check (LDPC) ECC) are generally sub-optimal and may be substantially improved, as described herein.

Accordingly, it would be desirable to provide a storage subsystem read voltage determination system that provides the read voltage determination improvements discussed above.

SUMMARY

According to one embodiment, an Information Handling System (IHS) includes a processing system; and a memory system that is coupled to the processing system and that includes instructions that, when executed by the processing system, cause the processing system to provide a storage subsystem read voltage determination engine that is configured to: read, from a first storage subsystem at a plurality of different read voltage sets, data; generate, for each of the plurality of read voltage sets, a respective bit error probability distribution of a number of bit errors per codeword provided by the data read from the first storage subsystem; generate an error correction capability graph associated with error correction code used by the first storage subsystem; determine, for each of the plurality of read voltage sets based on the bit error probability distributions and the error correction capability graph, a respective average codeword error rate; and identify, from the average codeword error rates, a first read voltage set that is included in the plurality of read voltage sets and for which a minimum average codeword error rate was determined.

BRIEF DESCRIPTION OF THE DRAWINGS

FIG. 10 is a graph view illustrating an embodiment of the determination of an average codeword error rate using the bit error probability distributions graph of FIG. 7 and the error correction capability graph of FIG. 9.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
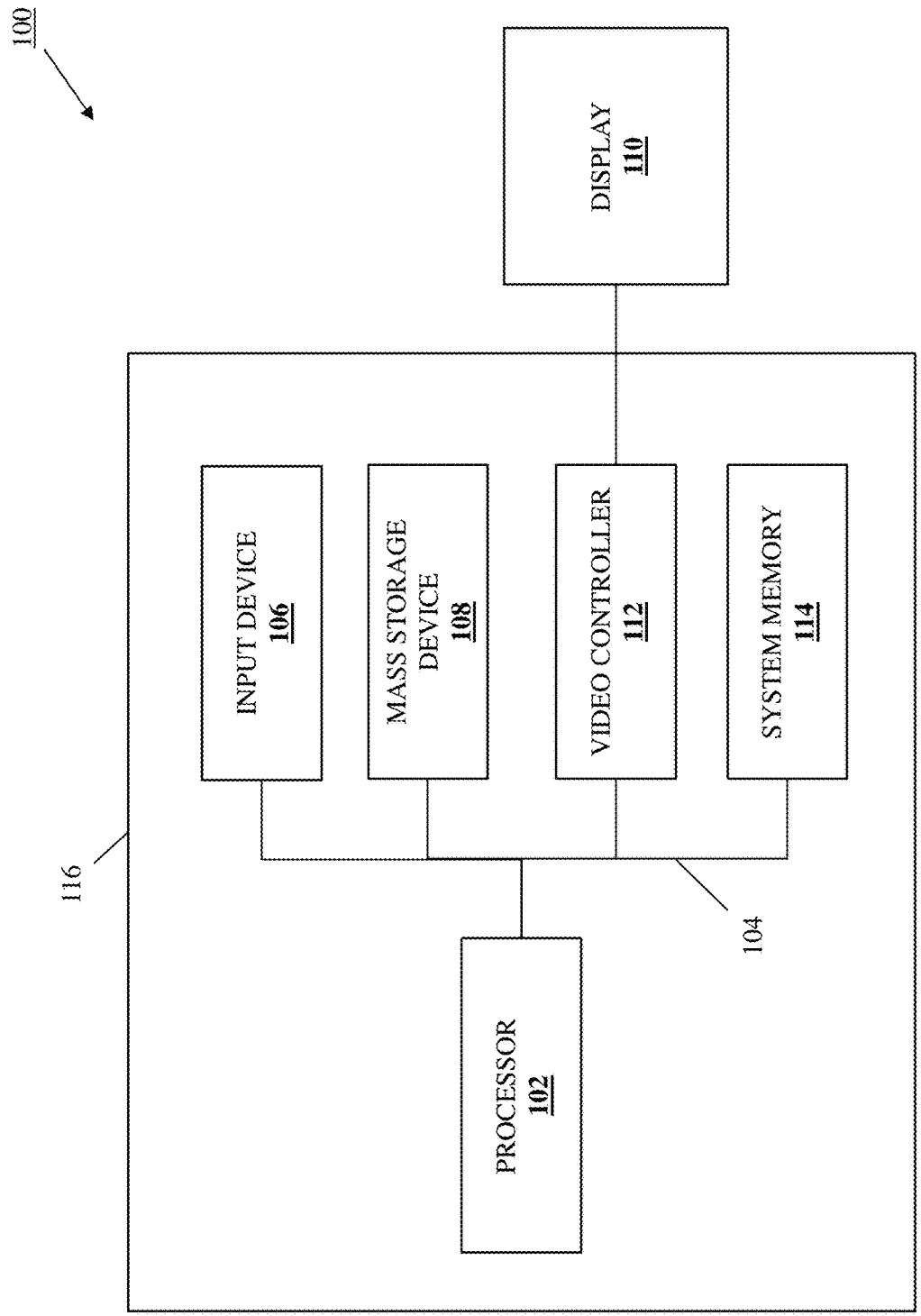
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
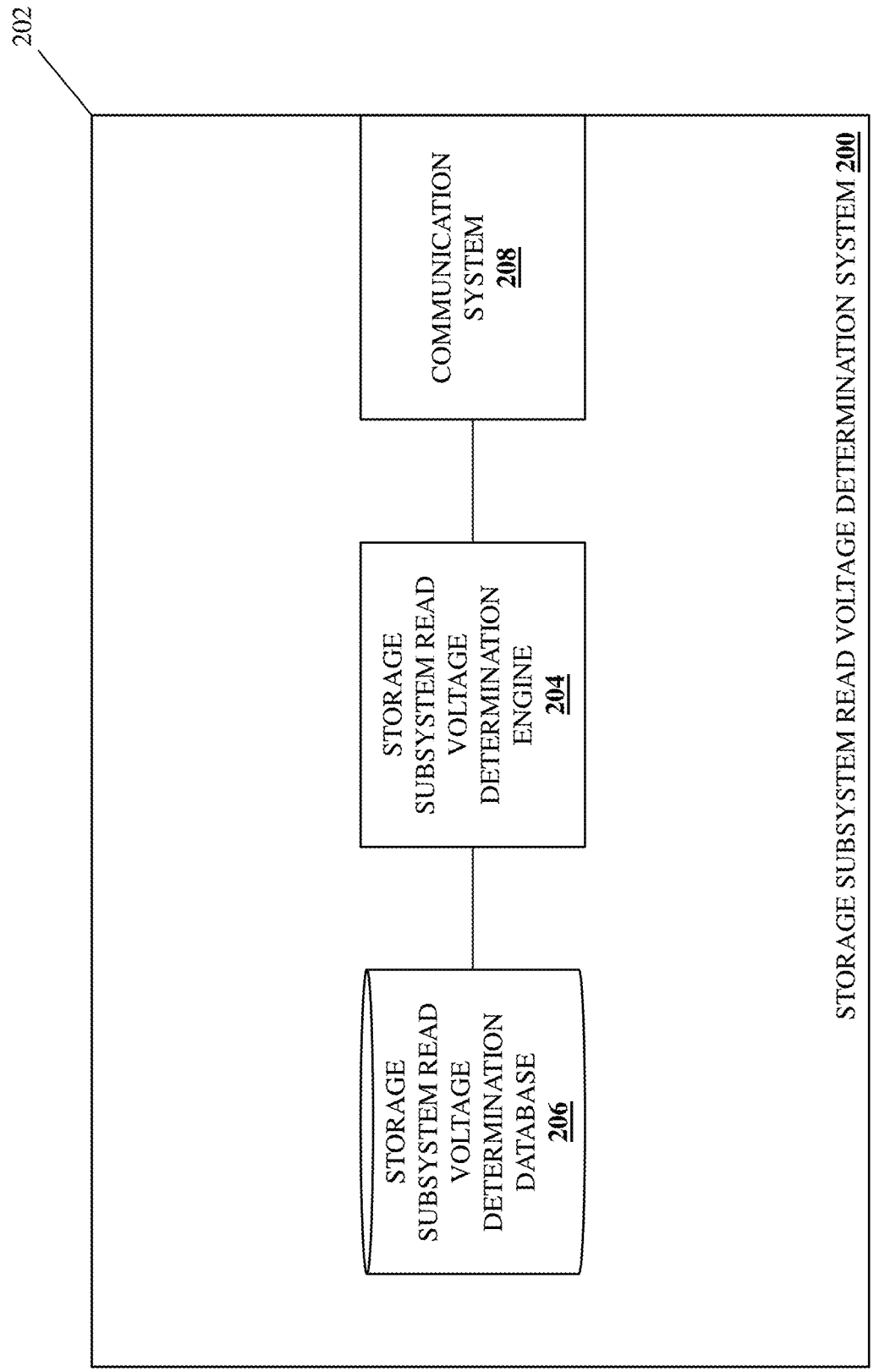
FIG. 2 is a schematic view illustrating an embodiment of a storage subsystem read voltage determination system provided according to the teachings of the present disclosure.

Referring now to FIG. 2, an embodiment of a storage subsystem read voltage determination system 200 is illustrated. In an embodiment, the storage subsystem read voltage determination system 200 may be provided by the IHS 100 discussed above with reference to FIG. 1 and/or may include some or all of the components of the IHS 100, and in specific examples may be provided by one or more server devices, desktop computing devices, laptop/notebook computing devices, and/or other computing devices known in the art that one of skill in the art in possession of the present disclosure would recognize as being capable of performing the storage subsystem read voltage determination functionality on storage devices. As will be appreciated by one of skill in the art in possession of the present disclosure, the storage subsystem read voltage determination system 200 may be provided by one or more devices included at one or more storage subsystem characterization and storage device provisioning location(s) at which different types of storage subsystems are characterized to determine the read voltages discussed below, with those read voltages then provided in storage devices that include those types of storage subsystems. To provide a specific example, the storage subsystem read voltage determination system 200 may be provided at one or more locations controlled by DELL® Inc. of Round Rock, Texas, United States, and may be utilized to identify read voltages according to the techniques described below for use with different types of NAND storage subsystems, and provide those respective read voltages in storage devices that include the corresponding types of NAND storage subsystems.

Furthermore, while illustrated and described as being provided by particular devices at particular locations, one of skill in the art in possession of the present disclosure will recognize that the functionality of the storage subsystem read voltage determination system 200 discussed below may be provided in other location(s) by other devices that are configured to operate similarly as the storage subsystem read voltage determination system 200 discussed below. In the illustrated embodiment, the storage subsystem read voltage determination system 200 includes a chassis 202 that houses the components of the storage subsystem read voltage determination system 200, only some of which are illustrated and discussed below. For example, the chassis 202 may house a processing system (not illustrated, but which may include one or more of the processor 102 discussed above with reference to FIG. 1) and a memory system (not illustrated, but which may include one or more of the memory 114 discussed above with reference to FIG. 1) that is coupled to the processing system and that includes instructions that, when executed by the processing system, cause the processing system to provide a storage subsystem read voltage determination engine 204 that is configured to perform the functionality of the storage subsystem read voltage determination engines and/or storage subsystem read voltage determination systems discussed below.

The chassis 202 may also house a storage system (not illustrated, but which may include the storage 108 discussed above with reference to FIG. 1) that is coupled to the storage subsystem read voltage determination engine 204 (e.g., via a coupling between the storage system and the processing system) and that includes a storage subsystem read voltage determination database 206 that is configured to store any of the information utilized by the storage subsystem read voltage determination engine 204 discussed below. The chassis 202 may also house a communication system 208 that is coupled to the storage subsystem read voltage determination engine 204 (e.g., via a coupling between the communication system 208 and the processing system) and that may be provided by a Network Interface Controller (NIC), wireless communication systems (e.g., BLUETOOTH®, Near Field Communication (NFC) components, WiFi components, etc.), and/or any other communication components that would be apparent to one of skill in the art in possession of the present disclosure. However, while a specific storage subsystem read voltage determination system 200 has been illustrated and described, one of skill in the art in possession of the present disclosure will recognize that storage subsystem read voltage determination systems (or other devices operating according to the teachings of the present disclosure in a manner similar to that described below for the storage subsystem read voltage determination system 200) may include a variety of components and/or component configurations for providing conventional storage subsystem read voltage determination system functionality, as well as the functionality discussed below, while remaining within the scope of the present disclosure as well.

Figure 3:
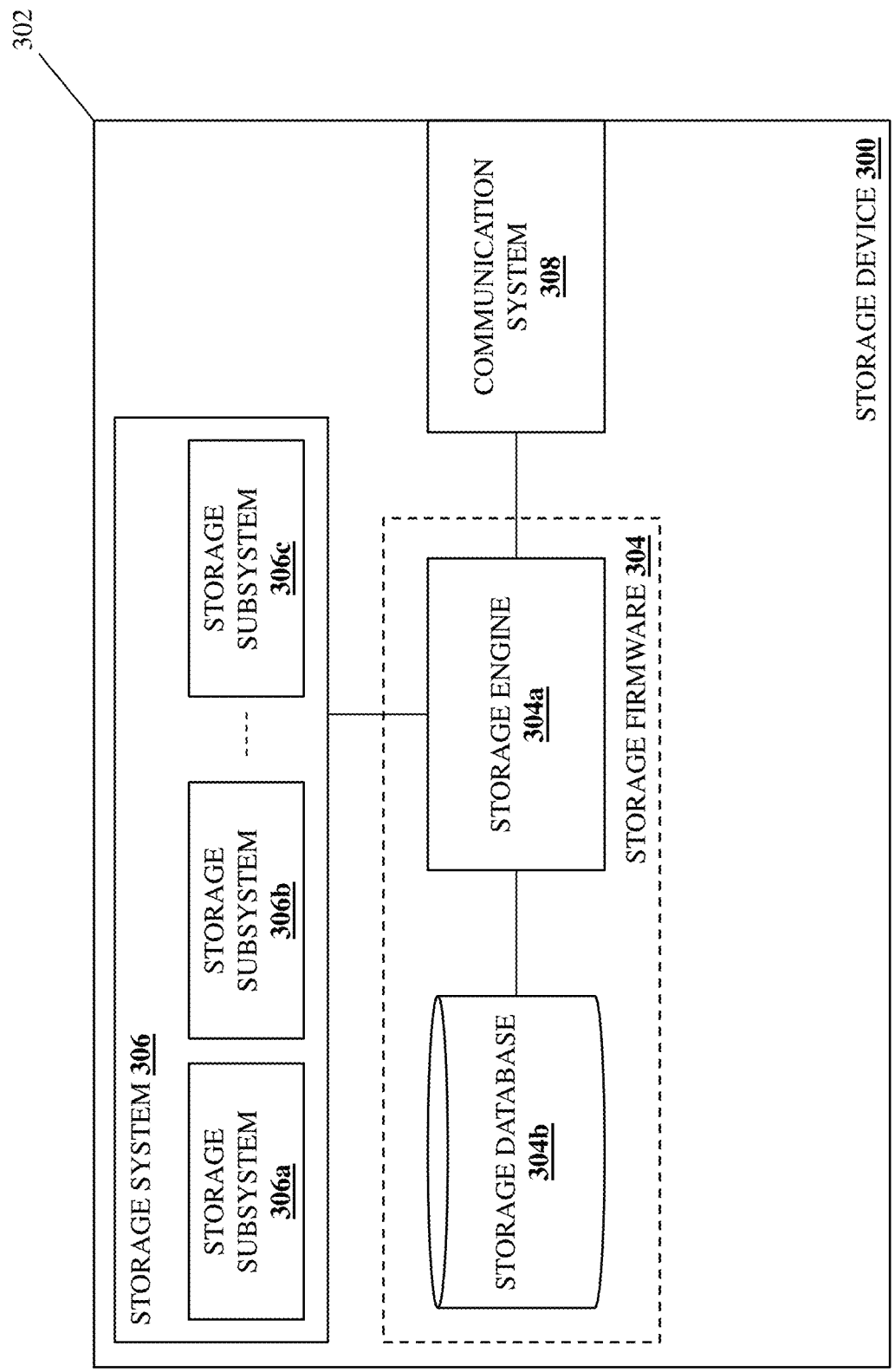
FIG. 3 is a schematic view illustrating an embodiment of a storage device that may be provided with the storage subsystem read voltages determined according to the teachings of the present disclosure.

Referring now to FIG. 3, an embodiment of a storage device 300 is illustrated that may be provided with the read voltages determined by the storage subsystem read voltage determination system discussed above with reference to FIG. 2. As such, the storage device 300 may be provided by the IHS 100 discussed above with reference to FIG. 1 and/or may include some or all of the components of the IHS 100, and in specific examples below is described as being provided by a Solid-State Drive (SSD) storage device. However, while illustrated and discussed as being provided by an SSD storage device, one of skill in the art in possession of the present disclosure will recognize that the functionality of the storage device 300 discussed below may be provided by other types of storage devices that are configured to operate similarly as the storage device 300 discussed below. In the illustrated embodiment, the storage device 300 includes a chassis 302 that houses the components of the storage device 300, only some of which are illustrated and discussed below. For example, the chassis 302 may house a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to provide storage firmware 304 including a storage engine 304a that is configured to perform the functionality of the storage engines, storage firmware, and/or storage devices discussed below, and a storage database 304b that is configured to store any of the information utilized by the storage engine 304a discussed below.

The chassis 302 may also house a storage system 306 that is coupled to the storage engine 304 (e.g., via a coupling between the storage system 306 and the processing system) and that includes a plurality of storage subsystems 306a, 306b, and up to 306c. In the specific examples provided below, the storage subsystems 306a-306c are described as being provided by NAND storage subsystems, but one of skill in the art in possession of the present disclosure will appreciate how other types of storage subsystems may benefit from the teachings of the present disclosure and thus will fall within its scope as well. The chassis 302 may also house a communication system 308 that is coupled to the storage engine 304a (e.g., via a coupling between the communication system 308 and the processing system) and that may be provided by any of a variety of storage device communication components that would be apparent to one of skill in the art in possession of the present disclosure. However, while a specific storage device 300 has been illustrated and described, one of skill in the art in possession of the present disclosure will recognize that other types of storage devices may include storage systems that may have their read voltages determined based on the teachings of the present disclosure while falling within its scope as well.

Figure 4:
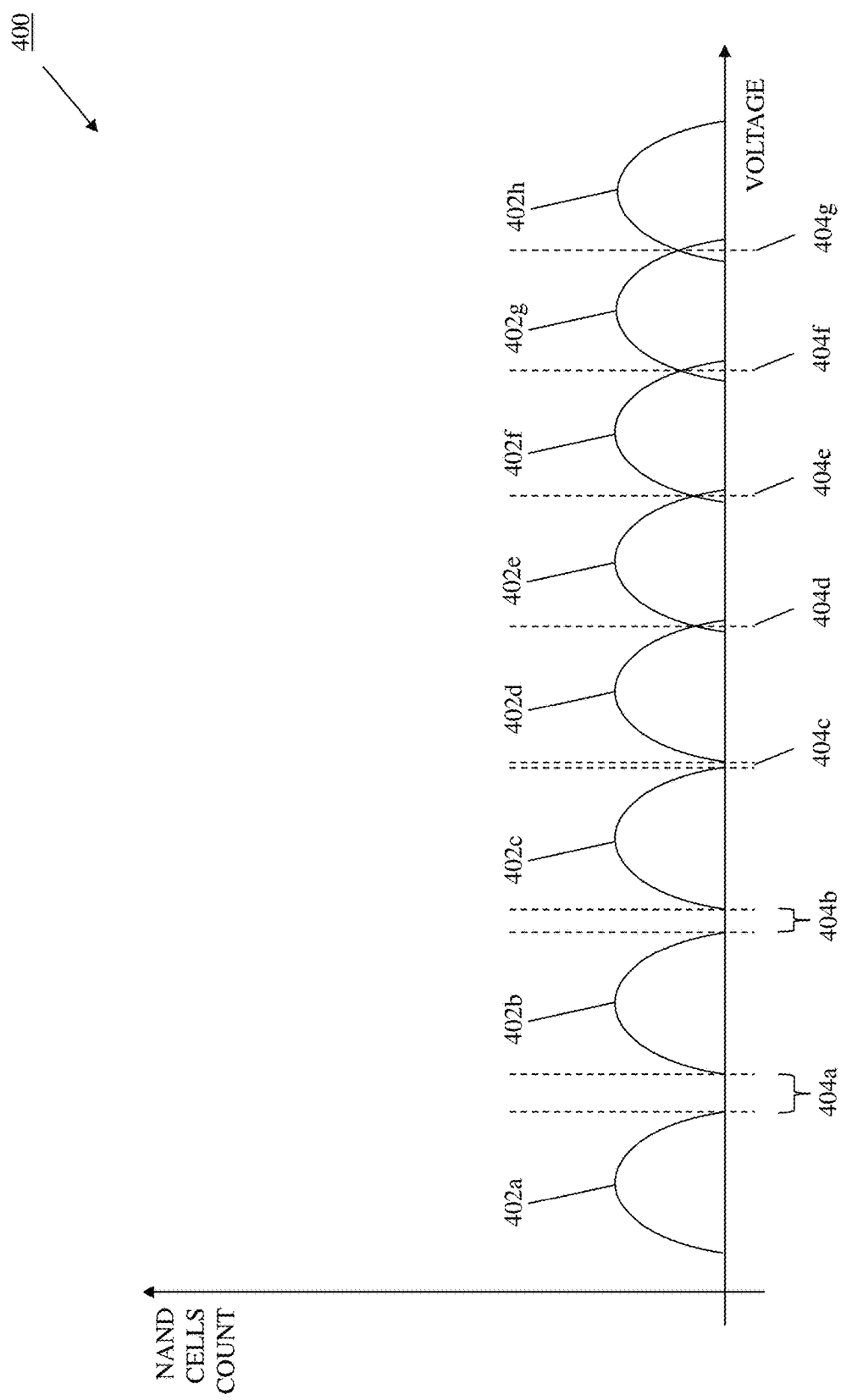
FIG. 4 is a graph view illustrating an embodiment of NAND cell voltage distributions for a NAND cell that may be included in a storage subsystem included in the storage device of FIG. 2.

With reference to FIG. 4, an embodiment of NAND cell voltage distributions 400 is provided to illustrate an example of the read voltages discussed herein. As will be appreciated by one of skill in the art in possession of the present disclosure, the NAND storage subsystems discussed above may include includes a NAND package having a plurality of NAND dies, with each NAND die including a plurality of NAND planes, and each NAND plane including a plurality of NAND blocks made up from an array of NAND cells. Furthermore, each NAND block may include a plurality of NAND wordlines (e.g., which each may be provided by the NAND cells that provide a row in a NAND block), and each NAND wordline may include a plurality of NAND pages. One of skill in the art in possession of the present disclosure will recognize how the NAND cells discussed above operate to store data, and the NAND cell voltage distributions 400 illustrated in FIG. 4 provide an example of NAND cells that are configured to store 3 bits and, thus, 8 possible states 402a, 402b, 402c, 402d, 402e, 402f, 402g, and 402h. However, while one of skill in the art in possession of the present disclosure will recognize that the NAND cells described herein provide an example of NAND cells utilizing Triple-Level-Cell (TLC) technology, NAND cells that utilize Quad-Level-Cell (QLC), Single-Level-Cell (SLC) technology, and/or other data storage technologies will fall within the scope of the present disclosure as well.

As will be appreciated by one of skill in the art in possession of the present disclosure, the voltage distributions of NAND cells will vary as a function of the condition of NAND storage subsystem (e.g., based on Program/Erase (P/E) cycle count, data retention time, and/or other NAND storage subsystem conditions that would be apparent to one of skill in the art in possession of the present disclosure), as well as the condition of the storage device in which it is included (e.g., the temperature at which data is read and/or written, and/or other storage device conditions that would be apparent to one of skill in the art in possession of the present disclosure). Furthermore, even under the same set of conditions, NAND cell voltage distributions from NAND cells in different NAND wordlines, NAND blocks, or NAND dies may differ due to physical differences and/or variability in NAND storage subsystem manufacturing processes. As discussed above, read voltage determinations for NAND cells attempt to minimize the number of bit errors (i.e., data that was written as 0's and that is read as 1's, and data that was written as 1's and that is read as 0's) that occur in NAND read operations, and thus with reference to the NAND cell voltage distributions 400 in FIG. 4, read voltages should be provided in the voltage ranges 404a, 404b, and 404c between the non-overlapping neighboring states 402a/402b, 402b/402c, and 402c/402d, respectively, as well as at the voltages 404d, 404e, 404f, and 404g that provide the intersections of the overlapping neighboring states 402d/402e, 402e/402f, 402f/402g, and 402g/402h, respectively.

As would be appreciated by one of skill in the art in possession of the present disclosure, "optimal" read voltage determinations would adjust read voltages per NAND cell read in each NAND read operation. However, one of skill in the art in possession of the present disclosure will also appreciate that determining optimal read voltages for each NAND read operation in real-time is unrealistic due to, for example, the storage subsystem latency that would result, the need to dedicate processing resources that could otherwise be used by the host, etc. As such, the read-voltage determinations of the present disclosure operate to "pre-determine" read voltages for any particular type of NAND storage subsystem (e.g., SLC NAND storage subsystems, MLC NAND storage subsystems, TLC NAND storage subsystems, QLC NAND storage subsystem, and/or other types of NAND storage subsystems that would be apparent to one of skill in the art in possession of the present disclosure) at different storage device conditions during NAND storage subsystem characterization, and then store those read voltages and storage device conditions in storage devices that utilize that type of NAND storage subsystem (e.g., in the storage database 304b of the storage firmware 304), with that storage device (e.g., the storage engine 304a in the storage firmware 304) then monitoring the NAND storage subsystem and storage device conditions in real-time and selecting a set of read voltages that will be used with all read operations from the NAND cells under any particular storage device conditions (e.g., that single set of read voltages may be applied to a population of codewords from different NAND wordlines, NAND blocks, and NAND dies when particular conditions are present in the NAND storage subsystem and storage device).

One of skill in the art in possession of the present disclosure will recognize that the goal of the systems and methods of the present disclosure for any particular set of read voltages is to have any bit errors that occur during read operations be correctable by Error Correction Code (ECC). As discussed in further detail below, the systems and methods of the present disclosure take into consideration an error correction capability of the ECC utilized with the NAND storage subsystem to determine, for all read operations for any particular set of conditions, read voltages that will minimize an average ECC Codeword Error Rate (CER), i.e., minimize the average number of codewords that, when read from the NAND storage subsystem, will be uncorrectable.

Figure 5:
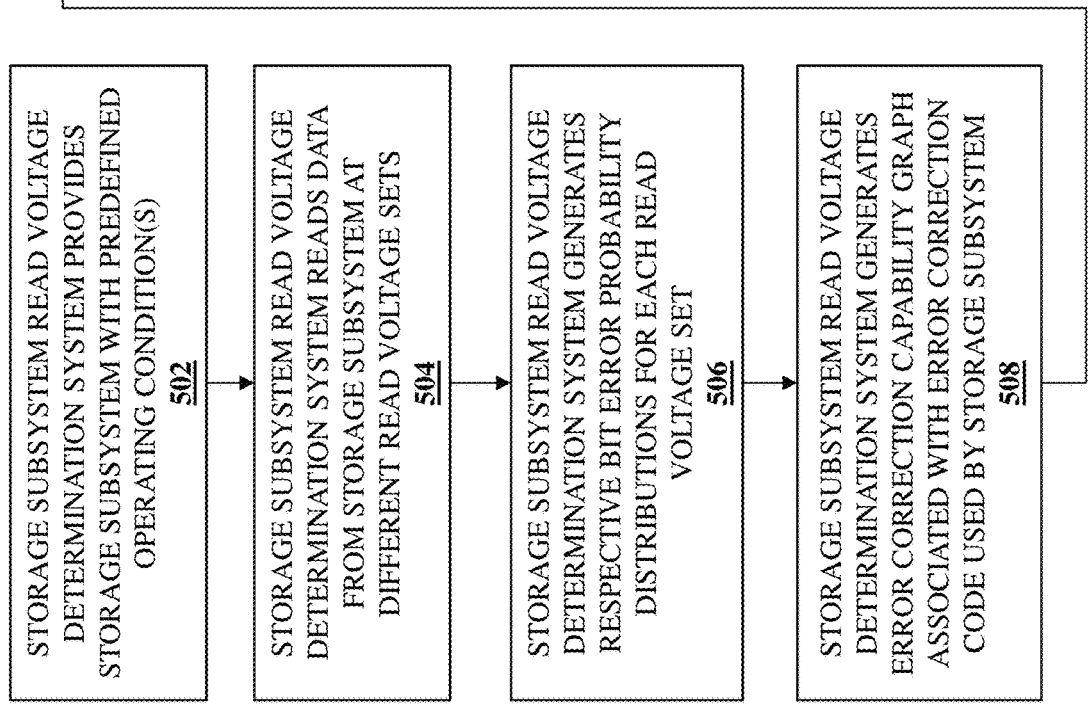
FIG. 5 is a flow chart illustrating an embodiment of a method for determining storage subsystem read voltages.

Referring now to FIG. 5, an embodiment of a method 500 for determining storage subsystem read voltages is illustrated. As described herein, the systems and methods of the present disclosure determine read voltages for a NAND storage subsystem that, for any particular set of conditions, will minimize the average number of codewords read from that NAND storage subsystem that will be uncorrectable. For example, the storage subsystem read voltage determination system of the present disclosure may be coupled to a first storage subsystem and may read data from the first storage subsystem at a plurality of different read voltage sets. For each of the plurality of read voltage sets, the storage subsystem read voltage determination system generates a respective bit error probability distribution of a number of bit errors per codeword provided by the data read from the first storage subsystem, and generates an error correction capability graph associated with error correction code used by the first storage subsystem. Based on the bit error probability distributions and the error correction capability graph, the storage subsystem read voltage determination system generates a respective average codeword error rate for each of the plurality of read voltage sets, and identifies a first read voltage set for which a minimum average codeword error rate was determined. The inventors of the present disclosure have discovered that the determination of read voltages for a NAND storage subsystem that minimize the average number of codewords that, when read from that NAND storage subsystem, will be uncorrectable provides particular benefits for ECC with error correction capability graphs that are non-linear (i.e., curves rather than step-functions), but one of skill in the art in possession of the present disclosure will appreciate how the teachings provided herein may be utilized with ECC having error correctional capability graphs that are linear (e.g., step-functions) while remaining within the scope of the present disclosure as well.

Figure 6:
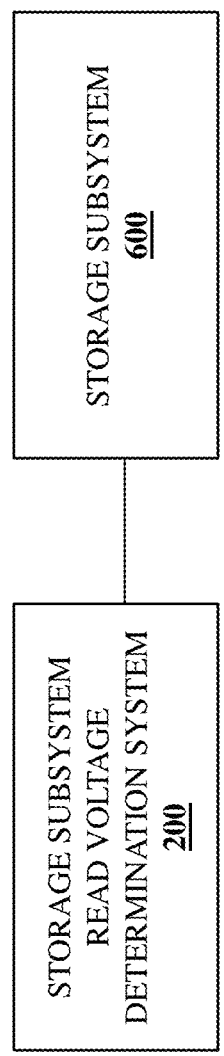
FIG. 6 is a schematic view illustrating an embodiment of the storage subsystem read voltage determination system of the present disclosure coupled to a storage subsystem during the method of FIG. 5.

The method 500 begins at block 502 where the storage subsystem read voltage determination system provides a storage subsystem with predefined operating condition(s). With reference to FIG. 6, in an embodiment of the method 500, the storage subsystem read voltage determination system 200 discussed above with reference to FIG. 2 may be coupled to a storage subsystem 600. As discussed above, the storage subsystem 600 may be provided by a NAND storage subsystem, and may be a type of NAND storage subsystem that will be utilized as one or more of the storage subsystems 306a, 306b, and/or 306c in the storage system 306 included in the storage device 300 discussed above with reference to FIG. 3. As discussed above, the storage subsystem read voltage determination system 200 may include any number of devices that are configured to characterize any type of the storage subsystem 600 in order to determine the read voltages discussed below, which then may be provided in storage devices (e.g., the storage device 300) that utilize storage subsystems that are the same type as the storage subsystem 600.

For example, in an embodiment of block 502, the storage subsystem read voltage determination system 200 may include one or more devices that are configured to provide the storage subsystem 600 with predefined operating conditions, which may include writing and erasing NAND blocks in the storage subsystem 600 to provide the storage subsystem 600 with a particular Program/Erase (P/E) cycle count operating condition, "baking" (i.e., increasing the temperature of) NAND dies in the storage subsystem 600 to provide the storage subsystem 600 with a particular data retention time effect, and/or performing any other operations in order to provide the storage subsystem 600 with any of a variety of predefined operating conditions that would be apparent to one of skill in the art in possession of the present disclosure. While a single set of operating conditions is described in the example of the method 500 below, one of skill in the art in possession of the present disclosure will recognize the method 500 may be performed for a plurality of different sets of predefined operating conditions, which as discussed above allows read voltage sets to be determined for each of those predefined operating conditions, and thus allows storage devices to be provided with read voltage set/operating condition combinations so that those storage devices may utilize different read voltage sets depending on its current operating conditions.

The method 500 then proceeds to block 504 where the storage subsystem read voltage determination system reads data from the storage subsystem at different read voltage sets. As will be appreciated by one of skill in the art in possession of the present disclosure, following the provisioning of the storage subsystem 600 with the predefined operating conditions, the storage subsystem read voltage determination engine 204 in the storage subsystem read voltage determination system 200 may write known data to the storage subsystem 600. For example, the known data written to the storage subsystem 600 may provide any known data pattern or data values in the NAND cells that provide the NAND blocks in the storage subsystem 600, with that known data configured to be compared to test data that is read from the storage subsystem 600 in order to determine bit errors resulting from the read. As such, one of skill in the art in possession of the present disclosure will appreciate how any of a variety of data may be written to the storage subsystem 600 and read at block 504 while remaining within the scope of the present disclosure as well.

In an embodiment of block 504, the storage subsystem read voltage determination engine 204 in the storage subsystem read voltage determination system 200 may read test data from the storage subsystem 600 at different read voltage sets. For example, a first read voltage set with respective read voltages may be utilized to read the known data that was written to the NAND cells in order to generate first test data; a second read voltage set with respective read voltages that include one or more read voltages that are different that those in the first read voltage set may be utilized to read the known data that was written to the NAND cells in order to generate second test data; and so on for as many read voltage sets as are desired to characterize the storage subsystem 600. As will be appreciated by one of skill in the art in possession of the present disclosure, the generation of the test data as discussed above will include performing the corresponding reads without ECC decoding, as the test data read from the NAND cells will be compared to the known data written to those NAND cells in order to identify a probability distribution of bit errors that occurred per codeword in response to the reads.

The method 500 then proceeds to block 506 where the storage subsystem read voltage determination system generates respective bit error probability distributions for each read voltage set. As discussed above, in an embodiment of block 506, the storage subsystem read voltage determination engine 204 in the storage subsystem read voltage determination system 200 may perform bit error identification operations that include identifying codewords included in the test data that was read from the storage subsystem 600 at block 504, comparing the codewords in the test data to the codewords in the known data that was written to the storage subsystem 600, and identifying bit errors in the codewords in the test data. Furthermore, for each read voltage set, the storage subsystem read voltage determination engine 204 may use the bit errors identified in the codewords in the test data that was read using that read voltage set to generate a bit error probability distribution that identifies the probability that different numbers of bit errors will be present in a codeword read using that read voltage set.

Figure 7:
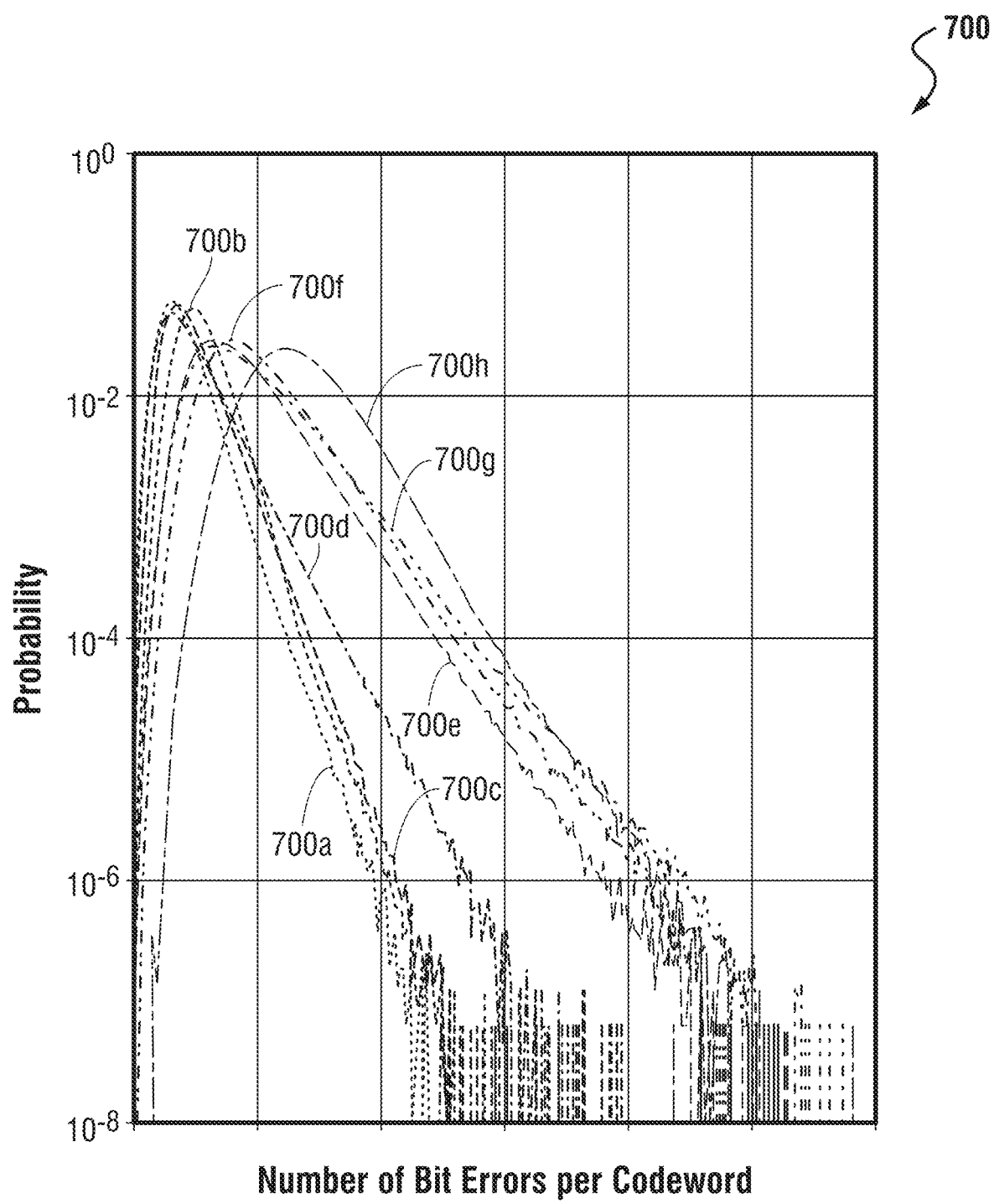
FIG. 7 is a graph view illustrating an embodiment of bit error probability distributions generated for a storage subsystem for different read voltages during the method of FIG. 5.

For example, FIG. 7 illustrates a bit error probability distributions graph 700 for a particular set of operating conditions that were provided for the storage subsystem 600 at block 502, and the specific example of the bit error probability distributions graph 700 includes eight bit error probability distributions 700*a*, 700*b*, 700*c*, 700*d*, 700*e*, 700*f*, 700*g*, and 700*h* that may have been generated by the storage subsystem read voltage determination engine 204 as discussed above based on eight different respective read voltage sets. As can be seen in the bit error probability distributions graph 700, changing the read voltage at which data is read from the storage subsystem 600 can substantially impact the probability distribution of the number of bit errors that will be present in codewords, and one of skill in the art in possession of the present disclosure will appreciate how there is not a single bit error probability distribution in the bit error probability distributions graph 700 having a lowest probability across the range of bit errors being measured (i.e., the bit error probability distribution 700*h* has a relatively lower probability for relatively low numbers of bit errors compared to others of the bit error probability distributions, while having a relatively higher probability for relatively higher numbers of bit errors compared to others of the bit error probability distributions).

As such, the information in the bit error probability distributions graph 700 is insufficient to minimize the average Codeword Error Rate (CER)/the average number of codewords that, when read from the NAND storage subsystem, will be uncorrectable. Thus, the systems and methods of the present disclosure utilize an error correction capability graph for the ECC code that is utilized with the storage subsystem 600 in order to perform the average CER minimization described herein. As discussed above, conventional storage subsystem read voltage determination techniques determine read voltages that minimize the average number of bit errors over all the codewords collected under particular conditions, which as detailed below is sub-optimal because it does not necessarily relate to the average CER, which the inventors of the present disclosure submit is the proper criteria for minimizing the number of read errors produced using a storage subsystem.

Figure 8:
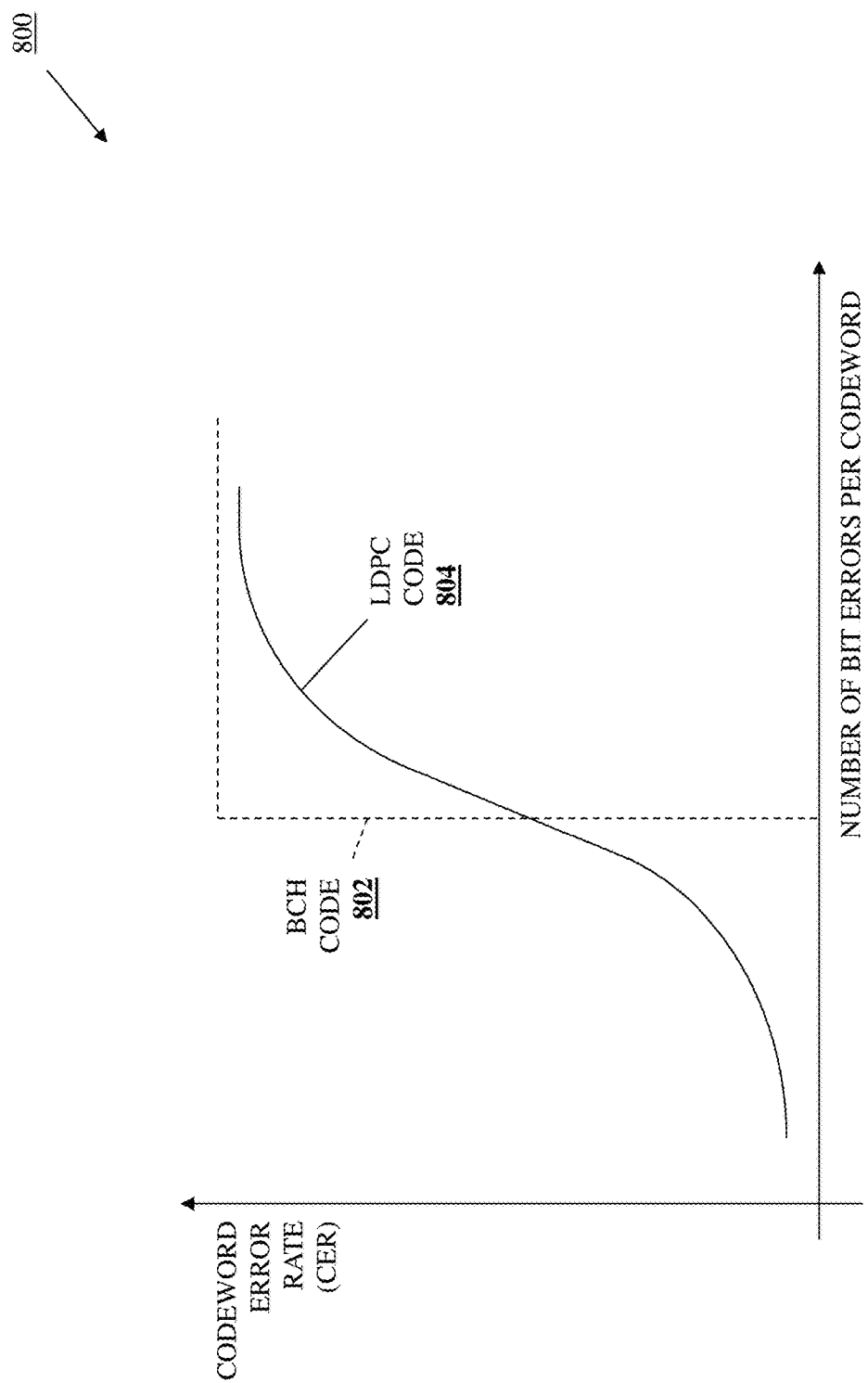
FIG. 8 is a graph view illustrating an embodiment of error correction capability graphs for different ECC code that may be utilized with a storage subsystem.

With reference to FIG. 8, error correction capability graphs 800 for different ECCs that may be utilized with a storage subsystem are illustrated, and in the specific example included herein provide a Bose, Chaudhuri, Hocquenghem (BCH) code error correction capability graph 802 (illustrated with a dash lines) for BCH code that may be utilized as ECC for a storage subsystem, and a Low-Density Parity Check (LDPC) code error correction capability graph 804 (illustrated with a solid line) for LDPC code that may be utilized as ECC for a storage subsystem.

As will be appreciated by one of skill in the art in possession of the present disclosure, BCH code was used in many early conventional SSD storage devices, and the BCH code error correction capability may be illustrated by the step function that provides the BCH code error correction capability graph 802. However, LDPC code is used in many of today's current SSD storage devices, and the LDPC code error correction capability may be illustrated by the curve that provides the LDPC code error correction capability graph 804 and that varies as a function of the number of bit errors per codeword. As will be appreciated by one of skill in the art in possession of the present disclosure, for any particular number of bit errors per codeword when LDPC code is used, the correctability of that codeword will depend on the locations of the bit errors in that codeword. Furthermore, an infinite number of LDPC codes may satisfy any particular parameters for codeword length and code rate ("code rate" referring to the percentage of bits utilized to store parity data), and thus the LDPC code error correction capability may also depend on the code structure/design. However, while a few factors that influence LDPC code error correction capability have been described, one of skill in the art in possession of the present disclosure will appreciate how other factors (e.g., decoder algorithms, etc.) may also affect LDPC code error correction capability while remaining within the scope of the present disclosure as well.

Figure 9:
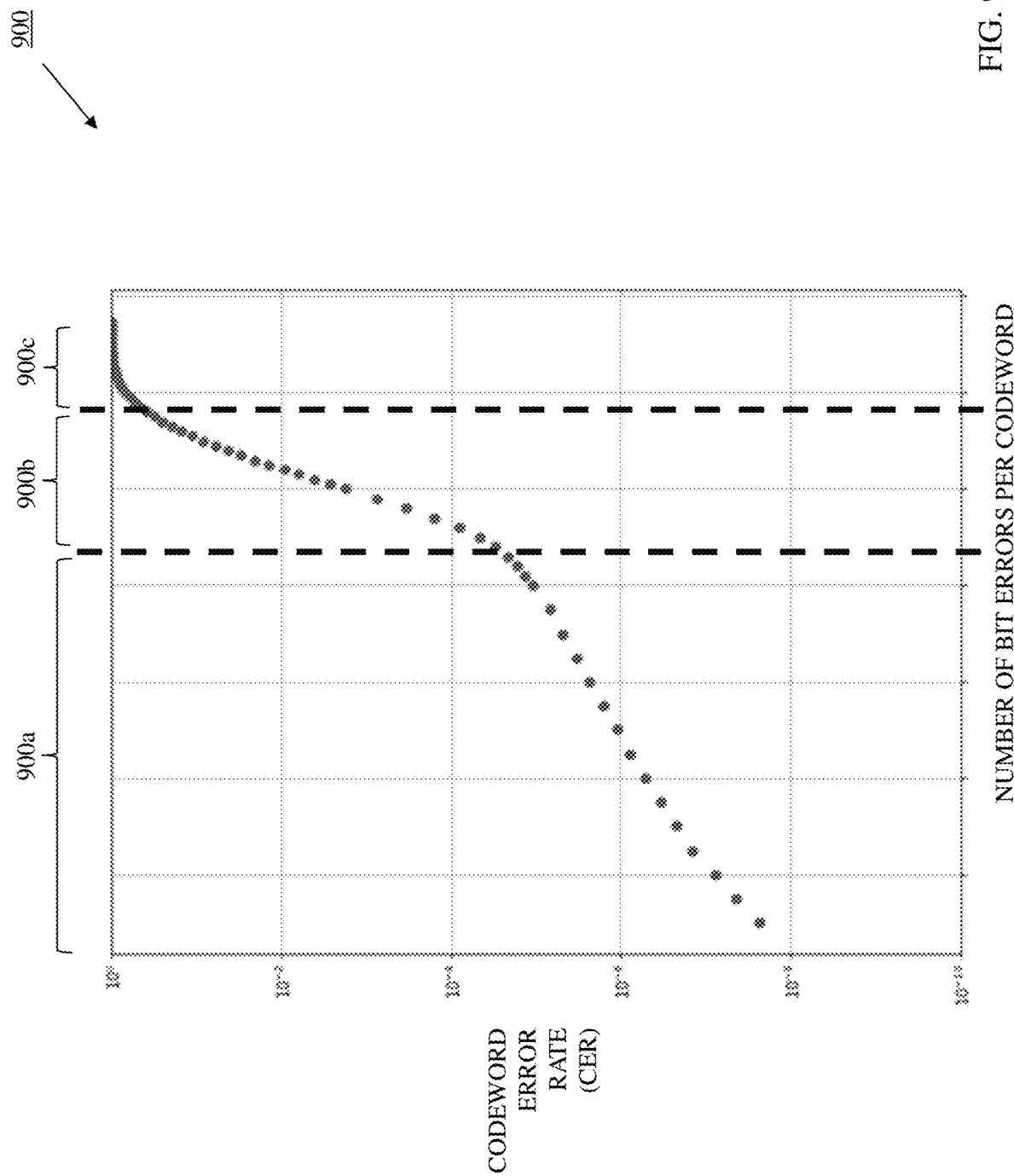
FIG. 9 is a graph view illustrating an embodiment of an error correction capability graph generated for a storage subsystem during the method of FIG. 5.

As such, the method 500 may proceed to block 508 where the storage subsystem read voltage determination system generates an error correction capability graph associated with error correction code used by the storage subsystem. With reference to FIG. 9, in an embodiment, of block 508, the storage subsystem read voltage determination engine 204 in the storage subsystem read voltage determination system 200 may generate an error correction capability graph 900 for the storage subsystem 600. For example, at block 508, the storage subsystem read voltage determination engine 204 may perform simulation operations (e.g., Monte-Carlo simulation operations) to generate the error correction capability curve 900, with simulation parameters utilized in the simulation operations matching how an ECC engine provided in a storage controller (e.g., which may be provided by the storage engine 304*a* in the storage device 300 discussed above with reference to FIG. 3) operates. However, in other examples, the storage subsystem read voltage determination engine 204 may perform error correction capability testing operations (e.g., including random error injection) on the storage subsystem 600 to generate error correction capability data, and use the error correction capability data (e.g., by measuring whether codewords are correctable with the injected error) to generate the error correction capability graph 900. However, while examples of an error correction capability graph simulation and actual measurement technique are described, one of skill in the art in possession of the present disclosure will appreciate how the error correction capability graph may be generated at block 508 in a variety of manners that will fall within the scope of the present disclosure as well.

As illustrated in FIG. 9, the inventors of the present disclosure conceptually divide the error correction capability graph 900 into three regions: an "error floor" region 900a, a "waterfall" region 900b, and an "uncorrectable" region 900c (which are divided in FIG. 9 by bolded dashed lines). The error floor region 900a of the error correction capability graph 900 includes a relatively slowly increasing CER as the number of bit errors per codeword increases, the waterfall region 900b of the error correction capability graph 900 includes a relatively rapidly increasing CER as the number of bit errors per codeword increases, and the uncorrectable region 900c of the error correction capability graph 900 includes a relatively large number of bit errors per codeword that are most likely uncorrectable.

As will be appreciated by one of skill in the art in possession of the present disclosure, the systems and methods of the present disclosure recognize that increases of bit errors in codewords in the error floor region 900a will not increase the CER substantially, while for codewords already in the uncorrectable region 900c, having more bit errors in the codewords will not affect the CER as the codewords are already uncorrectable. However, even a relatively small decrease in the number of bit errors for codewords in the waterfall region 900b can significantly lower the CER. As such, the systems and methods of the present disclosure operate to allow the number of bit errors for some codewords in the error floor region 900a and the uncorrectable region 900c to increase in exchange for a lower number of bit errors for some codewords in the waterfall region 900b, which as discussed below results in a net improvement in the average CER relative to traditional techniques that rely solely on minimizing the average number of bit errors per codeword and that tend to constrain the number of bit errors in the error floor region 900a and the uncorrectable region 900c relatively aggressively without corresponding average CER reduction benefits.

The method 500 then proceeds to block 510 where the storage subsystem read voltage determination system determines a respective average codeword error rate for each read voltage set based on the bit error probability distributions and the error correction capability graph. In an embodiment, at block 510, the storage subsystem read voltage determination engine 204 in the storage subsystem read voltage determination system 200 may determine a respective average codeword error rate for each read voltage set based on the bit error probability distributions in the bit error probability distribution graph 700 and the error correction capability graph 900. For example, FIG. 10 illustrates the bit error probability distributions graph 700 of FIG. 7 and the error correction capability graph 900 of FIG. 9 side-by-side to illustrate how an average Codeword Error Rate (CER) may be determined for a bit error probability distribution for a particular read voltage set j (e.g., the read voltage set used to generate the bit error probability distribution 700d in the example provided below), and one of skill in the art in possession of the present disclosure will appreciate how the discussion below may be utilized to determine an average CER for bit error probability distributions for each read voltage set at block 510 while remaining within the scope of the present disclosure.

With reference to FIG. 10, $p_i^j$ is the probability of having i bit errors per codeword using the read voltage set j, and $w_i$ is the CER of LDPC code when there are i bit errors per codeword. As such, the average CER for the read voltage set j may be determined by the following equation:

$$\Sigma_i w_i p_i^j$$

Thus, one of skill in the art in possession of the present disclosure will appreciate how a respective average codeword error rate for each read voltage set used to generate the bit error probability distributions may be determined. However, while a specific technique for determining an average CER has been described, one of skill in the art in possession of the present disclosure will appreciate how average codeword error rates may be determined using weighted averages and/or other averaging techniques known in the art.

The method 500 then proceeds to block 512 where the storage subsystem read voltage determination system identifies a first read voltage set for which a minimum average codeword error rate was determined. In an embodiment, at block 512, the storage subsystem read voltage determination engine 204 in the storage subsystem read voltage determination system 200 may identify a read voltage set for which a minimum CER was determined at block 510. As described herein, one goal of the systems and methods of the present disclosure is to minimize the average CER over all the read voltage sets (i.e., arg $\min_j \Sigma_i w_i p_i^j$), and one of skill in the art in possession of the present disclosure will appreciate how the determination of the average CER for each read voltage set utilized with the storage subsystem 600 will result in one of the average CERs determined for a corresponding read voltage set being lower than the other average CERs identified for other read voltage sets and, thus, that read voltage set may provide the minimum average CER that may be identified by the storage subsystem read voltage determination engine 204 at block 512.

As discussed below, minimizing the average CER is superior to minimizing the average number of bit errors per codeword when a set of pre-determined read voltages are available for application to a population of codewords from different NAND wordlines, NAND blocks, and NAND dies, with a relatively lower average CER associated with a relatively lower probability of triggering read retries using other read voltage set(s) (i.e., one of skill in the art in possession of the present disclosure will appreciate how the use of read voltages with relatively higher average CERs will trigger more read retries relative to read voltages with relatively lower average CERs, thus increasing average read latency, lowering QoS, and lowering average throughput). As such, the use of read voltages that have been determined according to the teachings of the present disclosure and that have a relatively lower average CER in a storage subsystem may result in lower read latencies from those storage subsystems, better QoS from the storage subsystems, higher read throughputs from those storage subsystems, higher random write throughputs in those storage subsystems (e.g., due to higher read throughputs for garbage collection), as well as other benefits that would be apparent to one of skill in the art in possession of the present disclosure.

The method 500 then proceeds to block 514 where the storage subsystem read voltage determination system provides the first read voltage set in a storage device. In an embodiment, at block 514, the storage subsystem read voltage determination engine 204 in the storage subsystem read voltage determination system 200 may provide the read voltage set, which was identified at block 512 based on it providing the minimum average CER, in a storage device (e.g., the storage device 300 discussed above with reference to FIG. 3). As will be appreciated by one of skill in the art in possession of the present disclosure, blocks 512 and 514 of the method 500 may be performed by devices that are separate from the devices that perform blocks 502-510 (e.g., one set of devices may determine read voltage sets that may be optimized for storage device, while another set of devices may provide those read voltage sets on the storage device). As discussed above, for any particular type of storage subsystem, the storage subsystem read voltage determination system 200 may determine a respective read voltage set for each of a plurality of storage subsystem/storage device conditions, and thus may generate and store (e.g., in the storage subsystem read voltage determination database 206) a plurality of read voltage sets in association with respective storage subsystem/storage device conditions for any particular type of storage subsystem. Subsequently, when a storage device implements a storage subsystem, the storage subsystem read voltage determination engine 204 may identify the type of that storage subsystem, use that storage subsystem type to retrieve the read voltage sets and associated storage subsystem/storage device conditions, and provide those read voltage sets and associated storage subsystem/storage device conditions in the storage device (e.g., in a the storage database 304b of the storage firmware 304 in the storage device 300).

As will be appreciated by one of skill in the art in possession of the present disclosure, the storage engine 304a of the storage firmware 304 in the storage device 300 may then, during its operation, identify current storage subsystem/storage device conditions (e.g., a current P/E cycles for the storage subsystem, a current data retention time for the storage subsystem, a current temperature, etc.), use those current storage subsystem/storage device conditions to retrieve the read voltage set associated with those storage subsystem/storage device conditions from the storage database 304b in the storage firmware 304, and use that read voltage set to perform reads from the storage subsystems 306a-306c in the storage system 306.

Figure 11:
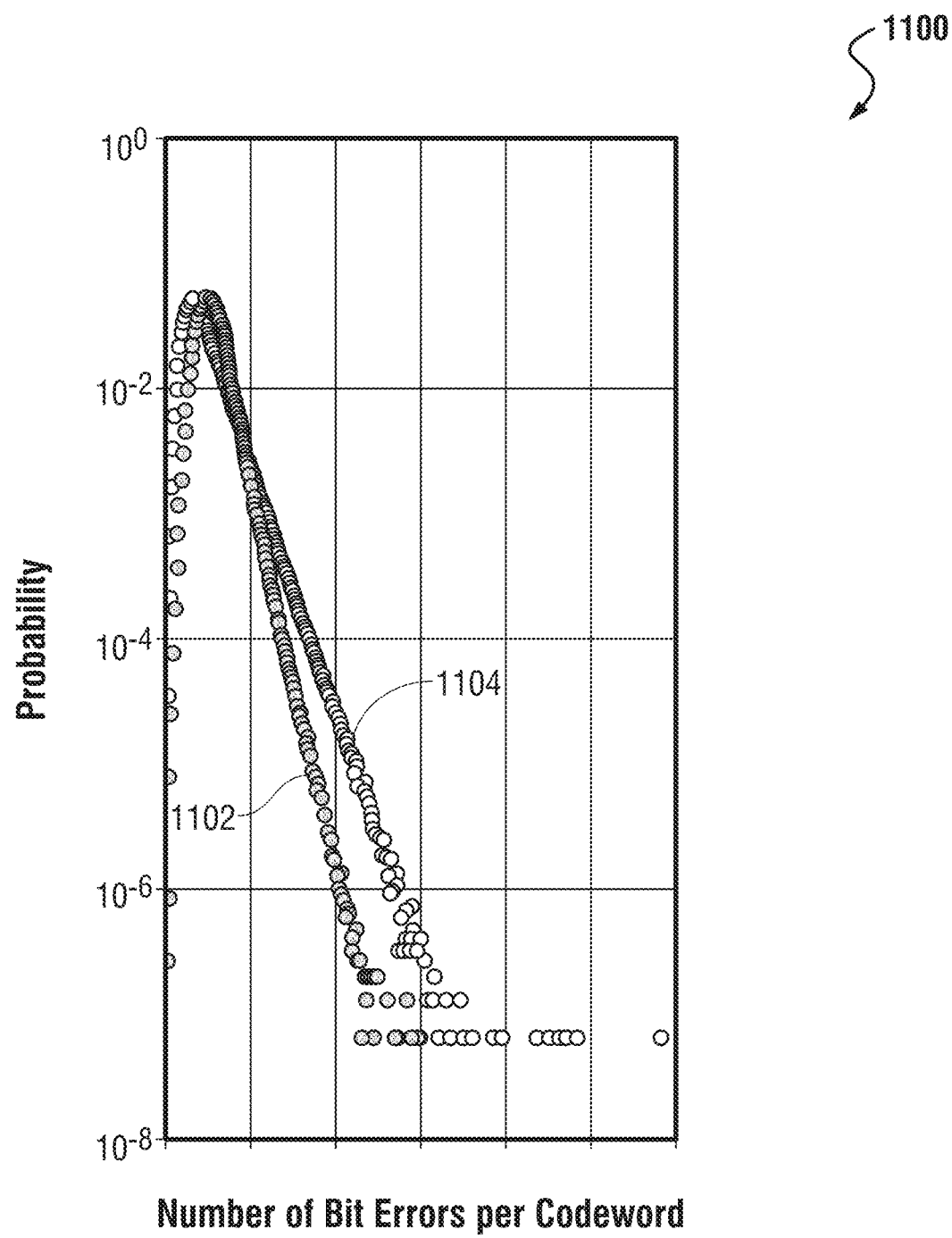
FIG. 11 is a graph view illustrating an embodiment of a comparison of a bit error probability distribution generated for a storage subsystem for a particular read voltage during the method of FIG. 5 vs. a conventional bit error probability distribution generated for a storage subsystem for a particular read voltage.

In experimental embodiments, the inventors of the present disclosure have determined that the systems and methods of the present disclosure provide substantial benefits over conventional techniques that determine read voltages based on minimization of the average number of bit errors per codeword. For example, FIG. 11 includes a graph of a bit error probability distribution 1102 generated for a storage subsystem for a read voltage set determined according to the techniques described above in the method 500, and a conventional bit error probability distribution 1104 generated for a storage subsystem for a read voltage set determined using conventional "minimum average number of bit errors per codeword" techniques, which resulted in the following data:

| TECHNIQUE | AVERAGE NUMBER OF BIT ERRORS PER CODEWORD | CODEWORD ERROR RATE (CER) |
| --- | --- | --- |
| MINIMUM AVERAGE NUMBER OF BIT ERRORS PER CODEWORD | 21.1 | 9.8E−06 |
| MINIMUM AVERAGE CER | 26.6 | 3.7E−07 |

As can be seen, the conventional "minimum average number of bit errors per codeword" technique provides a lower average number of bit errors per codeword relative to the "minimum average CER" technique (i.e., 21.1 average bit errors per codeword vs. 26.6 average bit errors per codeword), but provides a higher average CER relative to the "minimum average CER" technique (i.e., a 9.8E−06 average CER vs. a 3.7e-07 average CER). In particular, the conventional "minimum average number of bit errors per codeword" technique provides an average number of bit errors per codeword that is ~26% lower than the relative to the "minimum average CER" technique, but an average CER that is 26× higher.

With reference back to FIG. 11, one of skill in the art in possession of the present disclosure will appreciate how the conventional bit error probability distribution 1104 includes relatively more codewords in its "waterfall" region and "uncorrectable" region (discussed above with reference to FIG. 9) relative to the bit error probability distribution 1102, which results in the higher average CER of the conventional bit error probability distribution 1104 relative to the bit error probability distribution 1102. Furthermore, the conventional bit error probability distribution 1104 includes relatively more codewords with relatively few bit errors in its "error floor" region (discussed above with reference to FIG. 9) relative to the bit error probability distribution 1102, which results in the average number of bit errors per codeword being lower despite having more uncorrectable codewords.

Thus, systems and methods have been described that determine read voltages for a NAND storage subsystem that, for any particular set of conditions, will minimize the average number of codewords read from that NAND storage subsystem that will be uncorrectable. For example, the storage subsystem read voltage determination system of the present disclosure may be coupled to a first storage subsystem and may read data from the first storage subsystem at a plurality of different read voltage sets. For each of the plurality of read voltage sets, the storage subsystem read voltage determination system generates a respective bit error probability distribution of a number of bit errors per codeword provided by the data read from the first storage subsystem, and generates an error correction capability graph associated with error correction code used by the first storage subsystem. Based on the bit error probability distributions and the error correction capability graph, the storage subsystem read voltage determination system generates a respective average codeword error rate for each of the plurality of read voltage sets, and identifies a first read voltage set for which a minimum average codeword error rate was determined.

As will be appreciated by one of skill in the art in possession of the present disclosure, the teachings of the present disclosure may be utilized to provide "offline" (e.g., outside of storage device operation) techniques for predetermining read voltages that minimize the average codeword error rate of a population of codewords under a specific set of storage subsystem and storage device conditions. Furthermore, while the teachings of the present disclosure may be particularly beneficial for ECCs such as LDPC code that include an error correction capability graph/curve that is tied to corresponding code structure and decoder algorithms (and is often obtained via Monte-Carlo simulations), application of the teachings of the present disclosure to other ECC regardless of the shape of its error correction capability graph (e.g., the BCH code with an error correction capability graph/step function discussed above) is envisioned as falling within the scope of the present disclosure as well.

Although illustrative embodiments have been shown and described, a wide range of modification, change and substitution is contemplated in the foregoing disclosure and in some instances, some features of the embodiments may be employed without a corresponding use of other features.

Accordingly, it is appropriate that the appended claims be construed broadly and in a manner consistent with the scope of the embodiments disclosed herein.

What is claimed is:

1. A storage subsystem read voltage provisioning system, comprising:
   a first storage subsystem; and
   a storage subsystem read voltage determination system that is coupled to the first storage subsystem and that is configured to:
      read, from the first storage subsystem at a plurality of different read voltage sets, data;
      generate, for each of the plurality of read voltage sets, a respective bit error probability distribution of a number of bit errors per codeword provided by the data read from the first storage subsystem;
      generate an error correction capability graph associated with an error correction code used by the first storage subsystem;
      determine, for each of the plurality of read voltage sets based on the bit error probability distributions and the error correction capability graph, a respective average codeword error rate; and
      identify, from the respective average codeword error rates, a first read voltage set that is included in the plurality of read voltage sets and that provides a minimum average codeword error rate.

2. The system of claim 1, wherein the error correction capability graph is a curve.

3. The system of claim 2, wherein the error correction code is a Low-Density Parity Check (LDPC) error correction code.

4. The system of claim 1, wherein the first storage subsystem includes a storage subsystem type, and wherein the storage subsystem read voltage determination system is configured to provide the first read voltage set in a storage device that includes a second storage subsystem that includes the storage subsystem type.

5. The system of claim 1, wherein the storage subsystem read voltage determination system is configured to perform simulation operations to generate the error correction capability curve.

6. The system of claim 1, wherein the storage subsystem read voltage determination system is configured to:
   perform error correction capability testing operations on the first storage subsystem to generate error correction capability data; and
   generate, using the error correction capability data, the error correction capability curve.

7. The system of claim 1, wherein the storage subsystem read voltage determination system is configured to:
   provide the first storage subsystem with at least one predefined operating condition.

8. An Information Handling System (IHS), comprising:
   a processing system; and
   a memory system that is coupled to the processing system and that includes instructions that, when executed by the processing system, cause the processing system to provide a storage subsystem read voltage determination engine that is configured to:
      read, from a first storage subsystem at a plurality of different read voltage sets, data;
      generate, for each of the plurality of read voltage sets, a respective bit error probability distribution of a number of bit errors per codeword provided by the data read from the first storage subsystem;
      generate an error correction capability graph associated with an error correction code used by the first storage subsystem;
      determine, for each of the plurality of read voltage sets based on the bit error probability distributions and the error correction capability graph, a respective average codeword error rate; and
      identify, from the respective average codeword error rates, a first read voltage set that is included in the plurality of read voltage sets and that provides a minimum average codeword error rate.

9. The IHS of claim 8, wherein the error correction capability graph is a curve.

10. The IHS of claim 9, wherein the error correction code is a Low-Density Parity Check (LDPC) error correction code.

11. The IHS of claim 8, wherein the first storage subsystem includes a storage subsystem type, and wherein the storage subsystem read voltage determination engine is configured to provide the first read voltage set in a storage device that includes a second storage subsystem that includes the storage subsystem type.

12. The IHS of claim 8, wherein the storage subsystem read voltage determination engine is configured to perform simulation operations to generate the error correction capability curve.

13. The IHS of claim 8, wherein the storage subsystem read voltage determination engine is configured to;
   perform error correction capability testing operations on the first storage subsystem to generate error correction capability data; and
   generate, using the error correction capability data, the error correction capability curve.

14. A method for determining storage subsystem read voltages, comprising:
   reading, by a storage subsystem read voltage determination system from a first storage subsystem at a plurality of different read voltage sets, data;
   generating, by the storage subsystem read voltage determination system for each of the plurality of read voltage sets, a respective bit error probability distribution of a number of bit errors per codeword provided by the data read from the first storage subsystem;
   generating, by the storage subsystem read voltage determination system, an error correction capability graph associated with an error correction code used by the first storage sub system;
   determining, by the respective storage subsystem read voltage determination system for each of the plurality of read voltage sets based on the bit error probability distributions and the error correction capability graph, a respective average codeword error rate; and
   identifying, by the storage subsystem read voltage determination system from the average codeword error rates, a first read voltage set that is included in the plurality of read voltage sets and that provides a minimum average codeword error rate.

15. The method of claim 14, wherein the error correction capability graph is a curve.

16. The method of claim 15, wherein the error correction code is a Low-Density Parity Check (LDPC) error correction code.

17. The method of claim 14, wherein the first storage subsystem includes a storage subsystem type, and wherein the method further comprises:
   providing, by the storage subsystem read voltage determination system, the first read voltage set in a storage device that includes a second storage subsystem that includes the storage subsystem type.

18. The method of claim 14, wherein the method further comprises:
performing, by the storage subsystem read voltage determination system, simulation operations to generate the error correction capability curve.

19. The method of claim 14, further comprising:
performing, by the storage subsystem read voltage determination system, error correction capability testing operations on the first storage subsystem to generate error correction capability data; and
generating, by the storage subsystem read voltage determination system using the error correction capability data, the error correction capability curve.

20. The method of claim 14, further comprising:
providing, by the storage subsystem read voltage determination system, the first storage subsystem with at least one predefined operating condition.

* * * * *